United States Patent [19]
Selk et al.

[11] Patent Number: 5,677,515
[45] Date of Patent: Oct. 14, 1997

[54] SHIELDED MULTILAYER PRINTED WIRING BOARD, HIGH FREQUENCY, HIGH ISOLATION

[75] Inventors: Kenneth Charles Selk, Hermosa Beach; Harold J. Hirsch, Encino; James Carl Canyon, Torrance; Frederick M. Gower, Manhattan Beach, all of Calif.

[73] Assignee: TRW Inc., Redondo Beach, Calif.

[21] Appl. No.: 778,552

[22] Filed: Oct. 18, 1991

[51] Int. Cl.$^6$ ........................................ H05K 1/02
[52] U.S. Cl. ............... 174/255; 174/265; 174/250; 174/35 R; 361/816
[58] Field of Search ............... 174/250, 255, 174/261, 262, 265, 35 R; 361/388, 386, 412, 414, 417, 424

[56] References Cited

U.S. PATENT DOCUMENTS

| | | | |
|---|---|---|---|
| 4,801,489 | 1/1989 | Nakagawa et al. | 174/35 R X |
| 4,882,454 | 11/1989 | Petersson et al. | 361/386 X |
| 4,904,968 | 2/1990 | Theus | 174/250 X |
| 4,963,697 | 10/1990 | Peterson et al. | 361/414 X |
| 5,053,921 | 10/1991 | Nelson et al. | 361/386 |
| 5,072,075 | 12/1991 | Lee et al. | 174/255 X |
| 5,106,308 | 4/1992 | Gollomp et al. | 174/252 X |
| 5,121,299 | 6/1992 | Frankeny et al. | 174/261 X |
| 5,129,142 | 7/1992 | Bindra et al. | 174/262 X |

*Primary Examiner*—Laura Thomas
*Attorney, Agent, or Firm*—Michael S. Yatsko

[57] ABSTRACT

A shielded printed wiring board is disclosed which provides electrical and magnetic isolation for the signal layers located thereon. The printed wiring board includes a signal layer laminated between two non-conductive dielectric layers. The bottom side of the printed wiring board has a conductive layer coated thereon. Grooves are routed through the printed circuit board on both sides of each signal layer extending from the top layer partially through to the conductive layer. Conductive metallic coatings are then provided to coat the board and thereby encapsulate the signal layer in a ground envelope, separated by a controlled thickness dielectric. In an alternate embodiment, a plurality of layers are laminated one on top of the other to provide a multilayer printed wiring board.

12 Claims, 3 Drawing Sheets

SHIELDED MULTILAYER PRINTED WIRING BOARD, HIGH FREQUENCY, HIGH ISOLATION

BACKGROUND OF THE INVENTION

1. Technical Field

This invention relates to printed circuit boards and, more particularly, to a shielded multilayer printed wiring board which effectively isolates the signal layers thereon.

2. Discussion

There is a need for a shielded multilayer printed wiring board that effectively isolates the signal layers of the wiring board without detaching the shielded unit from the overall printed circuit board. This need exists especially for electrical interconnection of high frequency signals where high isolation is necessary.

Many integrated circuits, microwave components and various electrical devices operate in the gigahertz (GHz) frequency range. To interconnect modules containing these devices, in the one to one hundred GHz frequency range, coaxial cables have generally been employed. In doing so, typical isolation requirements greater than 100 dB are generally required. However, these shielded coaxial cables add to the size and weight of the system. This added size and weight is undesirable, especially for systems employed for space-defense related applications and the like. In addition, the use of coaxial cables further involves high assembly costs and complexity. Furthermore, shielded coaxial cables generally do not provide the shortest possible distance between components. Therefore, this additional distance may be undesirable especially for systems which operate with microwave components.

Printed circuit board design and fabrication techniques have been developed for fabricating signal layers on a printed wiring board. Lamination, machining (milling) and plating methods are common methods used in the industry to fabricate printed wiring boards. Use of such printed wiring boards, in place of coaxial cables, greatly increases the module density, significantly reduces the size, weight and costs of such systems and simplifies the assembly thereof. The increased density provided by such printed wiring boards provides for a shorter distance in which the signal must travel. This shorter signal travel distance is especially desirable for systems employing microwave components where such distance may affect system performance. However, current techniques do not provide the best obtainable isolation for the signal layers on the printed wiring board, without detaching the shielded unit from the overall printed circuit board.

It is therefore desirable to provide a shielded multilayer printed wiring board which effectively isolates the signal layers of the printed board without detaching the shielded unit from the overall printed circuit board.

SUMMARY OF THE INVENTION

In accordance with the teachings of the present invention, a flat shielded multilayer printed wiring board is provided which has signal layers which are effectively isolated therein. The printed wiring board includes a signal layer located between two non-conductive dielectric layers. The bottom side of the printed wiring board has a conductive layer thereon. Grooves are routed through the printed circuit board on both sides of each signal layer extending from the top layer down to at least the conductive layer. A conductive metallic coating covers the board and the grooves and thereby encapsulates the signal layer in a ground envelope, separated by a controlled thickness dielectric.

BRIEF DESCRIPTION OF THE DRAWING

The various advantage of the present invention will become apparent to those skilled in the art by reading the following specification and by reference to the following drawings in which:

FIG. 4 (view B) is an edge view of the board shown in FIG. 4 (view A); and

FIG. 4 (view C) is a partial view of FIG. 4 (view B).

DETAILED DESCRIPTION OF THE PREFERRED EMBODIMENT

Figure 1:
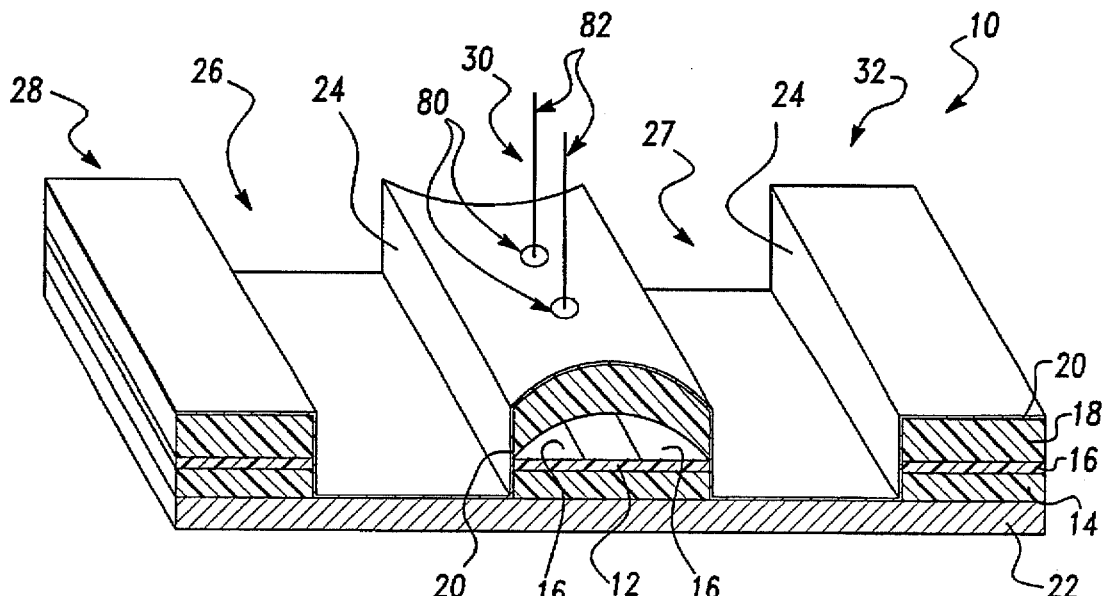
FIG. 1 is a perspective partial cross sectional view which illustrates a shielded single layer printed wiring board in accordance with the teachings of the present invention.

Turning now to FIG. 1, a slice of a shielded single signal layer printed wiring board is shown therein. The printed wiring board 10 includes a flat conductive signal layer 12. The signal layer 12 is laminated between a first non-conductive dielectric layer 14 and a second non-conductive dielectric layer 18. An adhesive dielectric material 16 is located on the top and side portions of the signal layer 12 for allowing the signal layer 12 and dielectric layers 14 and 18 to adhere and thereby be laminated together. In an alternate construction, the adhesive dielectric material 16 may be omitted, and the laminate materials fused together directly. A conductive layer 22 is further provided on the bottom side of the first dielectric layer 14.

The resulting configuration as shown in FIG. 1 provides three vertically extending bars 28, 30 and 32 which are connected by the bottom conductive base layer 22 and are separated by two grooves 26 and 27. Bar 30 has the signal layer 12 defined therein. However, bars 28 and 30 may be adapted to include conductive signal layers in a like manner. A conductive coating 20 covers the printed wiring board 10 including the bars 28, 30 and 32, the grooves 26 and 27 and the vertical walls 24 thereof. This conductive coating may include copper, tin-lead or gold plating or other suitable conductive materials. As a result, the grooves 26 and 27 are rendered conductive and thereby encapsulate the signal layer in a ground envelope separated by a controlled thickness dielectric.

In fabricating the shielded single signal layer printed wiring board 10, the flat signal layer 12 is defined on a single sheet of control dielectric laminate material which is shown as the first dielectric layer 14. The signal layer 12 may be formed by standard photolithographic techniques known in the art. Such photolithographic techniques would involve the application of a photoresist or a maskant material to the copper clad laminate material, followed by subsequent etching or removal of unwanted copper. Alternatively, plating techniques may be used as well to define the signal trace. The second dielectric layer 18 is then placed on top of the signal layer 12 and first dielectric layer 14 and adhered thereto by a dielectric adhesive material 16. Alternate construction methods such as a fusion process, may omit the adhesive material 16 and still achieve acceptable bond strength.

A routing machine or laser cutting device which is preferably capable of providing controlled depth cutting to within 0.0015 inches, is then used to rout a channel or groove 26 part way through the upper layers of the printed wiring board 10. This channel or groove 26 extends down to or into, but not through, the bottom conductive base layer 22 on the bottom side of the printed wiring board 10. A routing machine would generally rout into the bottom conductive base layer 22. A laser cutting device would cut down to, but not into, the bottom conductive base layer 22. Likewise, a groove 27 is formed in the same manner on the other side of the signal layer 12.

Next, the entire top portion of the printed wiring board 10 is cleaned and plated with a metallic coating to thereby form a conductive layer surrounding the board and the routed grooves 26 and 27 located thereon. As a result, the grooves 26 and 27 (and their side walls 24) are rendered conductive and encapsulate the signal layer 12 in a ground envelope separated by a control thickness dielectric.

The printed wiring board 10 may be adapted to provide a plurality of connections therewith by accessing the signal layer 12. To access signal layer 12, a plurality of plated through holes 80 may be provided. The plated through holes may be formed by drilling (either conventionally or non-conventionally such as with a laser) vertically downward through the top of the printed wiring board 10 and partially into the signal layer 12. A plurality of wires or pins 82 are then placed into the plurality of holes 80 and connected (i.e., soldered) to the signal layer 12. Likewise, access to the signal layer 12 may be obtained from the bottom side of the printed wiring board 10 in a similar manner. In addition, the signal layer 12 may further be accessed from either end of the signal layer 12 with electrical connections made therewith. Such connections may include a wire or pin inserted into an opening extending outward from the axis of the signal layer 12 and connected therein.

Figure 2:
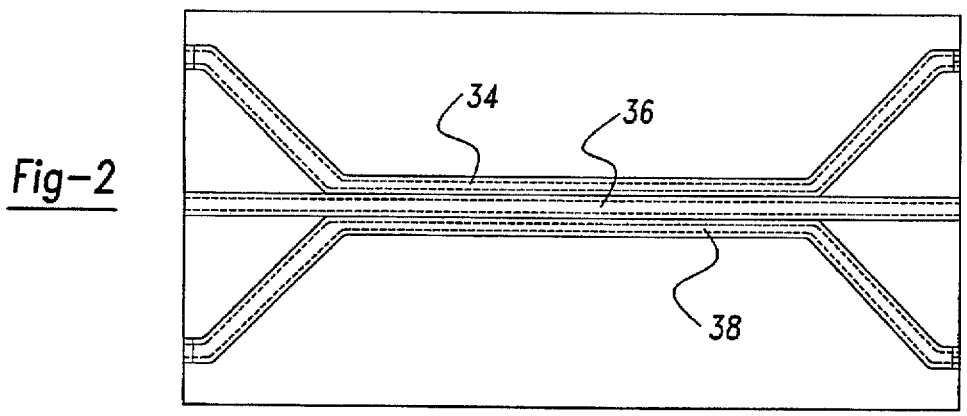
FIG. 2 is a top view of a single signal layer printed wiring board having three side-by-side shielded signal layers.

FIG. 2 illustrates three separate signal lines 34, 36 and 38 that are constructed in parallel and located within a single signal layer printed wiring board. Each of signal lines 34, 36 and 38 have plated grooves located between each other to provide the necessary isolation therebetween. This invention is not limited to the number of signal lines shown and therefore provides for any number of a plurality of signal lines and signal layers.

Figure 3B:
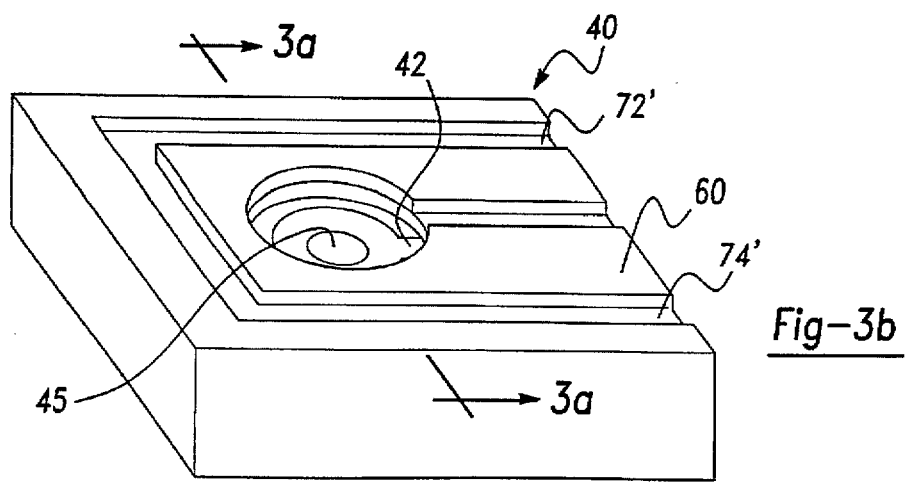
FIG. 3(b) is a top view of the board shown in FIG. 3(a)
Figure 3A:
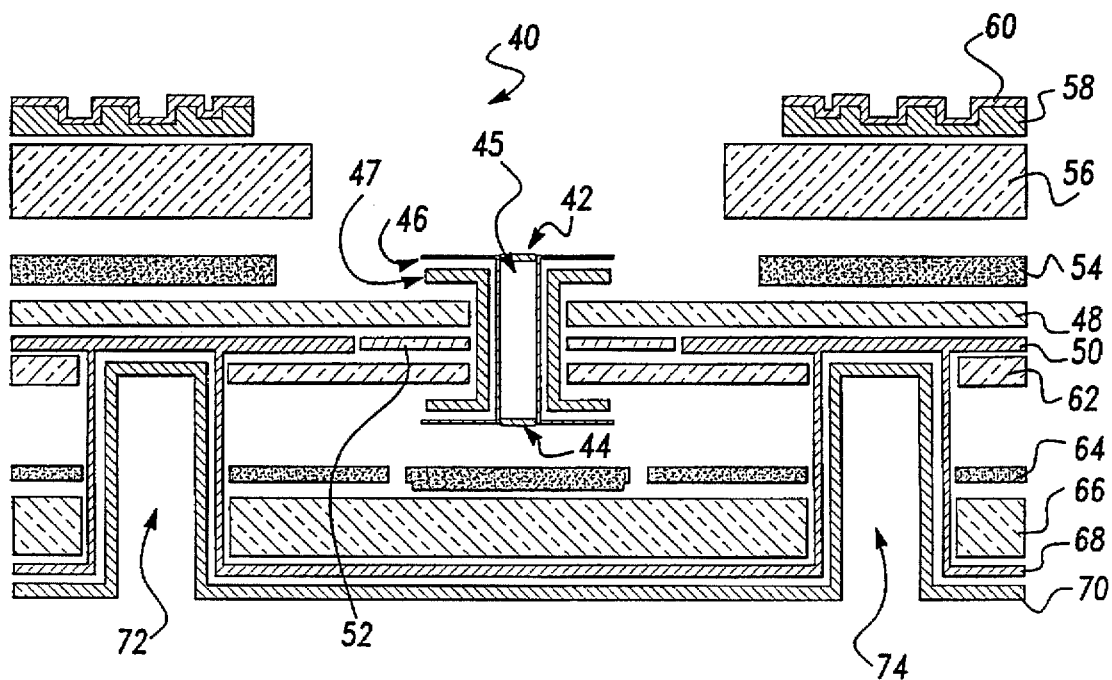
FIG. 3(a) is an exploded partial cross sectional view which illustrates a shielded dual signal layer printed wiring board in accordance with an alternate embodiment of the present invention taken along the lines view A—A of FIG. 3(b)

FIG. 3(a) illustrates an exploded cross-sectional view of a shielded dual signal layer printed wiring board 40 in accordance with an alternate embodiment of the present invention. FIG. 3(b) illustrates a top view of the upper portion of the dual signal layer board 40. The dual signal layer configuration shown provides a first shielded signal layer 42 that is fabricated on the top side of a printed wiring board 40 and a second shielded signal layer 44 that is fabricated on the bottom side of the printed wiring board 40. The first and second shielded signal layers 42 and 44 are fabricated essentially symmetrical about the center layer which is the conductive base layer 50 of the board 40. The first and second signal layers 42 and 44 are then connected by a conductive plated through hole 45 having two conductive layers 46 and 47 (i.e. gold plate over copper plate). The first signal layer 42 is adapted to be connected to the top portion of the plated through hole 45. The second signal layer 44 is adapted to be connected to the bottom portion of the plated through hole 45. The first and second signal layers 42 and 44 as shown in FIG. 3a extend outward from the plated through hole 45.

The first or upper signal layer 42 is sandwiched between a first non-conductive layer 48 on the bottom side and a second non-conductive layer 56 on the top side. Both non-conductive layers 48 and 56 include dielectric material such as Epoxy/glass, PTFE/Glass or other suitable dielectric materials. The bottom side of the non-conductive layer 48 is connected to a conductive base layer 50. The first signal layer 42 is laminated between non-conductive layers 48 and 56. The signal layer 42 and non-conductive layers 48 and 56 may be laminated together with a dielectric adhesive material 54 or fused together directly. The top side of the second non-conductive layer 56 is plated with a conductive material such as copper 58 and may be further plated with other suitable conductive materials such as tin, lead or gold plating as shown by layer 60.

The second signal layer 44 is formed below the first signal layer 42 in a similar manner. The second signal layer 44 is a flat conductor which is embedded or sandwiched between a first non-conductive layer 62 and a second non-conductive dielectric layer 66. Both non-conductive layers 62 and 66 include dielectric material such as Epoxy/glass, PTFE/Glass or other suitable dielectric material. Polytetrafluoroethane (PTFE)/Glass is a laminate material with a controlled dielectric constant and may include material such as RT/Duroid. The top side of the non-conductive layer 62 is connected to the conductive base layer 50. Conductive base layer 50 may be two separate conductive layers associated with the individual signal layers or may be one layer shared by both signal layers or variations thereof. The conductive base layer 50 has circular patches removed around the plated through holes 45 and replaced with a non-conductive dielectric filler material 52. The non-conductive dielectric filler material 52 provides isolation between the signal layers and the conductive base layer 50. Signal layer 44 is laminated or adhered between non-conductive layers 62 and 66 with a dielectric adhesive material 64. Alternately, fusion bonding may be used to join the nonconductive layers without an adhesive.

A first groove 72 is shown routed on one side of the second signal layer 44. Groove 72 is routed through the outer layers and extends up to or partially through the conductive base layer 50 located at the middle of the printed wiring board 40. Likewise, a second groove 74 is routed through the same layers on the opposite side of the second signal layer 44 in a similar manner. These grooves may further be joined beyond the termination points of the signal traces and thereby further surround the signal layer.

The bottom side of the second non-conductive dielectric layer 66 is then coated with a copper, tin-lead or gold plating as shown by outer conductive layers 68 and 70. Grooves 72 and 74 are likewise plated with the outer conductive layers 68 and 70 as shown therein. Together, grooves 72 and 74 provide a conductive channel which encapsulates the second signal layer 44 in a ground envelope, separated by a controlled thickness dielectric. The upper or first signal layer 42 is likewise adapted to have a first 72' and second groove 74' fabricated in a similar manner on both sides of the first signal layer 42 to provide the necessary isolation thereon. The dual signal configuration may be adapted to provide signal accessing on the top and bottom of the printed wiring board 40 by providing plated through holes (or blind vias) therein.

Figure 4A:
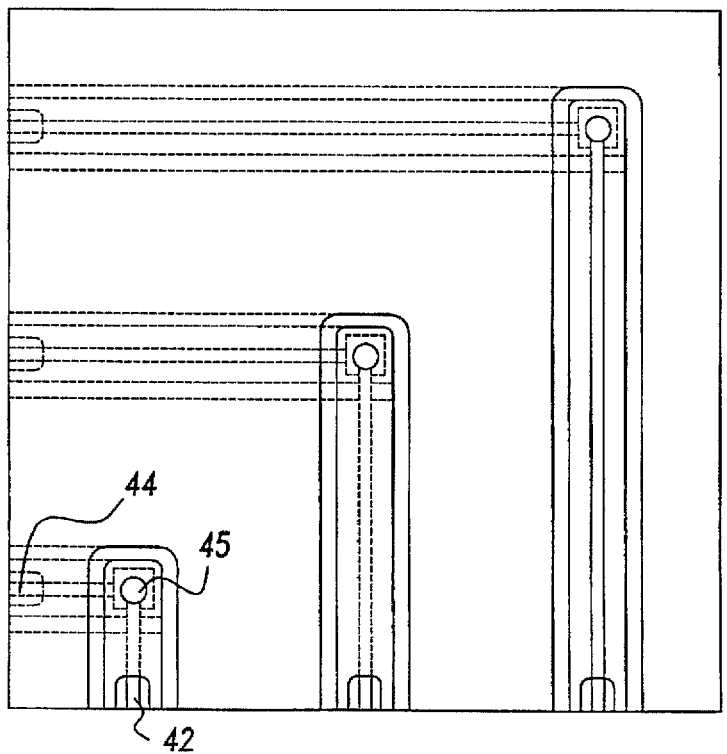
FIG. 4 (view A) is a scaled drawing which illustrates a shielded dual signal layer printed wiring board in accordance with an alternate embodiment of the present invention.
Figure 4B:
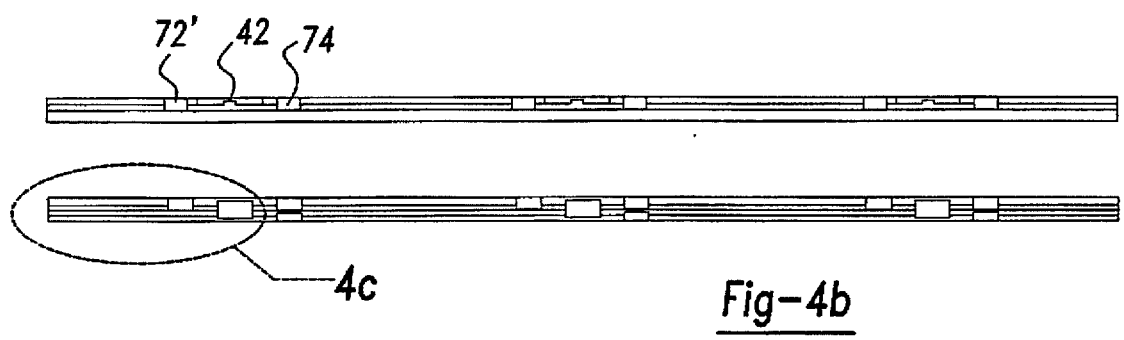
Figure 4C:
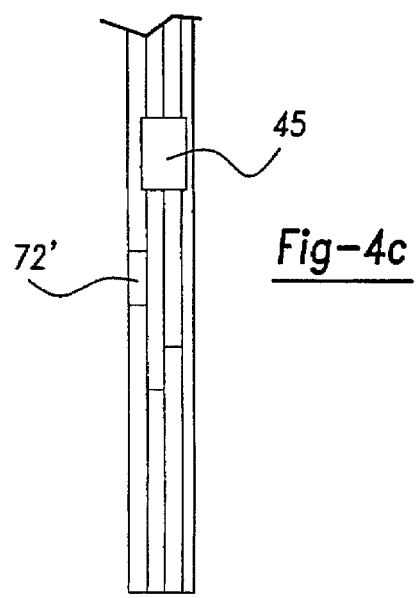

FIG. 4 (views A–C) illustrate a top view of a dual signal shielded printed wiring board in accordance with an alternate embodiment of the present invention. First signal layer 42 is shown therein being connected to a second signal layer 44 which is located below the first signal layer in a plane parallel therewith and positioned perpendicular thereto. The first and second signal layers 42 and 44 are connected therebetween by an encapsulated (or buried) plated through hole 45 or buried via.

This invention has been described in connection with a single and double layer signal. It should be appreciated that any number of a plurality of signal layers may be provided, each layer having a plurality of signals thereon, if desired.

In view of the foregoing, it can be appreciated that the present invention enables the user to achieve a shielded, printed wiring board which effectively isolates the signal layers thereon. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A shielded printed wiring board which isolates signal layers thereon, said printed wiring board comprising:

a first conductive signal layer having bottom and top surfaces;

a first non-conductive layer on the bottom surface of said first signal layer, said first non-conductive layer extending beyond opposite sides of said first signal layer;

a second non-conductive layer extending over the top surface of said first signal layer and said first non-conductive layer;

a conductive base layer having a top surface supporting the first non-conductive layer;

first and second grooves on opposite sides of said first signal layer and displaced therefrom, said grooves having walls extending through said first and second non-conductive layers and at least to said conductive base layer; and a conductive coating substantially covering the top of the second non-conductive layer and the walls of the grooves thereby cooperating with the base layer to provide a conductive shielding substantially surrounding the signal layer.

2. The printed wiring board as defined in claim 1 further comprising:

access means for accessing said first signal layer, said access means including a plurality of openings extending from said first signal layer; and a plurality of wires, said wires being inserted through said plurality of openings and connected to said first signal layer.

3. The printed wiring board as defined in claim 1, further comprising:

a second conductive signal layer having bottom and top surfaces;

a third non-conductive layer disposed on a bottom surface of said conductive base layer and having a top and bottom surface, the top surface of said second signal layer being defined on the bottom surface of said third non-conductive layer, with the top surface of said third non-conductive layer being connected to said conductive base layer;

a fourth non-conductive layer extending below said second signal layer and the bottom surface of the third non-conductive layer;

third and fourth grooves routed on opposite sides of said second signal layer and displaced therefrom, said third and fourth grooves having walls extending through said third and fourth non-conductive layers and at least to said conductive base layer; and a second conductive coating substantially encapsulating the bottom of the fourth non-conductive layer, as well as the walls of said third and fourth grooves so as to provide a conductive shielding substantially surrounding the second signal layer.

4. The printed wiring board as defined in claim 3 further comprising:

interconnection means including a plated through hole for connecting said first signal layer to said second signal layer, said plated through hole being isolated from said conductive base layer.

5. A shielded printed wiring board which isolates signal layers thereon said wiring board comprising:

a signal layer including a flat conductor;

a first non-conductive layer having a sheet of controlled dielectric material with top and bottom surfaces, said signal layer being defined on the top surface of said first non-conductive layer;

a second non-conductive layer having a sheet of controlled dielectric material with top and bottom surfaces, said signal layer and top surface of said first non-conductive layer being laminated to the bottom surface of said second non-conductive layer;

a conductive base layer extending across the bottom surface of said first non-conductive layer;

first and second grooves routed along the sides of said signal layer and displaced therefrom, said grooves having walls extending through said first and second non-conductive layers and at least to said conductive base layer;

a conductive coating encapsulating the plurality of layers and grooves of said wiring board thereby providing a conductive shielding surrounding the signal layer; and access means for accessing said signal layer to form electrical connection therewith.

6. The printed wiring board as defined in claim 5 wherein said access means comprises:

a plurality of openings extending outward from said signal layer; and a plurality of wires, said wires being inserted through said plurality of openings and connected to the signal layer.

7. The printed wiring board as defined in claim 1 further comprising:

access means including at least one hole extending into said board and exposing the signal layer; and conductor means including at least one conductor extending into each of said holes and providing electrical connection to said signal layer.

8. The printed wiring board as defined in claim 1 further comprising a plurality of conductive signal layers disposed between said first and second non-conductive layers and each of said signal layers having said first and second grooves formed displaced from the sides thereof.

9. A circuit board comprising:

an electrically conductive base layer;

a first layer of non-conductive material disposed on top of said conductive base layer;

an electrically conductive signal transmission line disposed on top of a portion of said first layer of non-conductive material;

a second layer of non-conductive material disposed on top of said signal transmission line and said first layer of non-conductive material, said first and second layers of non-conductive material extending beyond opposite sides of said signal transmission line;

conductive grooves formed along opposite sides of said signal transmission line and separated therefrom, said grooves having walls extending through said first and second layers of non-conductive material at least to said conductive base layer and providing electrical contact therewith; and an electrically conductive material substantially covering the top of said second layer of non-conductive material and said walls so as to form a conductive shield substantially surrounding said signal transmission line.

10. The circuit board as defined in claim 9 further comprising a plurality of signal transmission lines formed between said first and second layers of non-conductive material and having conductive grooves formed along sides of each of said signal transmission lines for providing conductive shields substantially surrounding each of said signal transmission lines.

11. The circuit board as defined in claim 9 wherein said circuit board is a multiple layer circuit board which further comprises:

a third layer of non-conductive material disposed on bottom of said conductive base layer;

a second electrically conductive signal transmission line disposed on bottom of a portion of said third layer of non-conductive material;

a fourth layer of non-conductive material disposed on bottom of said second signal transmission line and said third layer of non-conductive material;

third and fourth grooves routed along opposite sides of said second signal transmission line and displaced therefrom, said third and fourth grooves having walls extending through said third and fourth layers of non-conductive material at least to said conductive base layer; and a second electrically conductive coating substantially covering the bottom of said fourth layer of non-conductive material and said walls so as to form a conductive shield substantially surrounding said second signal transmission line.

12. The circuit board as defined in claim 11 further comprising:

interconnection means including a plated through hole internally connecting said first signal transmission line to said second signal transmission line.

* * * * *